(12) United States Patent
Hirvonen et al.

(10) Patent No.: US 7,680,463 B2
(45) Date of Patent: Mar. 16, 2010

(54) METHOD AND ARRANGEMENT FOR TESTING A RADIO DEVICE

(75) Inventors: Taavi Hirvonen, Oulu (FI); Ari Immonen, Beijing (CN); Pekka Jakkula, Oulu (FI)

(73) Assignee: JOT Automation Oy, Oulunsalo (FI)

( * ) Notice: Subject to any disclaimer, the term of this patent is extended or adjusted under 35 U.S.C. 154(b) by 33 days.

(21) Appl. No.: 10/538,193

(22) PCT Filed: Dec. 19, 2003

(86) PCT No.: PCT/FI03/00976

§ 371 (c)(1), (2), (4) Date: Apr. 21, 2006

(87) PCT Pub. No.: WO2004/057348

PCT Pub. Date: Jul. 8, 2004

(65) Prior Publication Data

US 2006/0246843 A1 Nov. 2, 2006

(30) Foreign Application Priority Data

Dec. 20, 2002 (FI) ................................. 20022257

(51) Int. Cl.
*H04B 1/46* (2006.01)
(52) U.S. Cl. ................... 455/81; 455/67.11; 455/67.12; 455/80; 455/75.8; 455/115.1; 455/226.1; 455/271; 455/328; 455/227
(58) Field of Classification Search ............ 455/67.11, 455/81, 575.8, 115.1, 226.1, 227, 67.12, 455/80, 75.8, 271, 328
See application file for complete search history.

(56) References Cited

U.S. PATENT DOCUMENTS

| | | | | | |
|---|---|---|---|---|---|
| 3,383,630 | A | * | 5/1968 | Kuroda | 333/137 |
| 4,039,975 | A | * | 8/1977 | Debski | 333/122 |
| 4,162,500 | A | * | 7/1979 | Jacobi et al. | 343/772 |
| 4,409,566 | A | * | 10/1983 | Patton et al. | 333/26 |
| 4,962,384 | A | * | 10/1990 | Walker | 343/786 |

(Continued)

FOREIGN PATENT DOCUMENTS

EP 1223432 A1 7/2002

(Continued)

OTHER PUBLICATIONS

Robert E. Collin, "Foundation for Microwave Engineering", Second Edition, IEEE Press Series on Electromagnetic Wave Theory, *Institute of Electrical and Electronics Engineers, Inc.*, p. 205 (2001).

(Continued)

*Primary Examiner*—Matthew D Anderson
*Assistant Examiner*—April G Gonzales
(74) *Attorney, Agent, or Firm*—Hoffmann & Baron, LLP

(57) ABSTRACT

A method and an arrangement for testing a radio device without radiation losses are provided. The arrangement comprises a waveguide closed at both its ends and comprising a holder arranged to hold the radio device at least partly inside the waveguide in such a manner that the radiating part of the radio device remaining outside the waveguide is entirely inside the holder. The arrangement also comprises at least one coupling inside the waveguide for transmission and reception of a radio-frequency signal.

21 Claims, 3 Drawing Sheets

U.S. PATENT DOCUMENTS

| | | | |
|---|---|---|---|
| 5,374,938 A * | 12/1994 | Hatazawa et al. | 343/756 |
| 5,619,213 A | 4/1997 | Hays, III | |
| 5,760,660 A * | 6/1998 | Nagatsu et al. | 333/126 |
| 5,969,580 A * | 10/1999 | Maillet et al. | 333/26 |
| 6,021,315 A * | 2/2000 | Telewski | 455/67.11 |
| 6,088,582 A * | 7/2000 | Canora et al. | 455/226.1 |
| 6,188,365 B1 * | 2/2001 | Mattsson et al. | 343/703 |
| 6,215,448 B1 | 4/2001 | DaSilva et al. | |
| 6,272,337 B1 * | 8/2001 | Mount et al. | 455/423 |
| 6,329,953 B1 * | 12/2001 | McKivergan | 343/703 |
| 6,587,671 B1 * | 7/2003 | Kanago et al. | 455/67.11 |
| 6,606,064 B1 * | 8/2003 | Lusterman | 343/703 |
| 6,654,472 B1 * | 11/2003 | Jeon | 381/349 |
| 6,662,648 B2 * | 12/2003 | Fehrenbach et al. | 73/290 V |
| 6,765,161 B1 * | 7/2004 | Wong et al. | 200/182 |
| 7,068,121 B2 * | 6/2006 | Ding et al. | 333/26 |
| 2002/0127971 A1 * | 9/2002 | Chen et al. | 455/67.4 |
| 2002/0160717 A1 * | 10/2002 | Persson et al. | 455/67.1 |
| 2002/0167282 A1 * | 11/2002 | Kirkpatrick et al. | 315/248 |

FOREIGN PATENT DOCUMENTS

| | | |
|---|---|---|
| JP | 09-083201 | 3/1997 |

OTHER PUBLICATIONS

Official Action—Finnish priority application No. 20022257.

* cited by examiner

METHOD AND ARRANGEMENT FOR TESTING A RADIO DEVICE

CROSS-REFERENCE TO RELATED APPLICATION

This application is a National Phase application of International Application No. PCT/FI2003/000976 filed Dec. 19, 2003, which claims priority to Finnish Patent Application Ser. No. 20022257, filed on Dec. 20, 2002, which are incorporated herein by reference.

FIELD OF THE INVENTION

The invention relates to a method and an arrangement for testing a radio device. The invention particularly relates to testing the radio-frequency characteristics of a radio device.

BACKGROUND OF THE INVENTION

The use of radio-frequency devices, particularly portable devices, such as mobile phones and radio receivers, for example, has notably increased. Many standard and agreements specify the characteristics of the devices. Given restrictions are set on the characteristics of particularly devices that transmit and receive a radio-frequency signal. Variation in the transmitter power of the device and any scattered radiation should be found out. Accordingly, at the manufacturing stage of the devices, it is essential that they can be tested reliably and easily. This enables the detection of any faulty devices or those requiring adjustment. Similar testing requirements may naturally exist also when a potentially malfunctioning device is brought in for servicing.

Testing the radio frequency characteristics of a radio device, particularly testing signal transmission and reception, is therefore extremely essential. However, said tests are technically very challenging. Radio-frequency tests, as tests generally, should be rendered as exempt from interference as possible. For example, in testing mobile phones, the transmission powers of the telephone have to be calibrated, the bit error ratio of a transferred signal has to be measured at a given RF power level, and other RF measurements have to be made, too. The propagation characteristics of radio signals cause a plurality of problems in testing design. Signal measurement should be rendered as exempt from interference as possible.

In most prior art solutions, the RF measurements used in radio device testing are based on contacting measurement methods. In these methods, the RF characteristics of a device are measured based on a contact, such as for instance by placing a measuring cable in an additional antenna connector or in lack thereof, placing a contact in the external antenna of the device. The antenna or the entire device can be enclosed for instance in a flexible sock made from a conductive material. The problem in these methods is that they are lossy and extremely sensitive to alignment and that the contactors wear in use. In addition, since even one manufacture may have various models that differ from each other as regards both technical characteristics and appearance, the measurement arrangement and the contactors have to be different for each model. Because of the lossiness and the wear of the contactors, the measurements are not very well repeatable.

Publications U.S. Pat. No. 5,619,213 and US 2002/0,127,971 disclose measurement arrangements wherein the antenna of terminals provided with an external antenna is placed into a cavity made from a conductive material. Radiation losses are created in the solutions and the requirement is that the device to be tested comprises an external antenna.

Publication U.S. Pat. No. 6,215,448 discloses a coaxial adapter arrangement. The solution is subject to the device tested having an external antenna and a chamber that is tightly closed as regards the radio frequency and lined with an absorbing material. In this solution, too, the radiation and coupling losses are significant.

BRIEF SUMMARY OF THE INVENTION

The object of the invention is to provide an improved method and arrangement for testing a radio device. This is achieved with the arrangement for testing a radio device comprising a waveguide closed at both its ends and comprising a holder arranged to hold the radio device at least partly inside the waveguide in such a manner that the radiating part of the radio device remaining outside the waveguide is entirely inside the holder. In the arrangement, the waveguide comprises one or more ridges, the end of at least one ridge facing the holder being bevelled, and one coupling inside the waveguide for transmission and reception of a radio-frequency signal by the use of the wideband mode of propagation.

The invention also relates to a method of testing a radio device, wherein the radio device to be tested is mounted by means of a holder at least partly inside a waveguide closed at both its ends. A wideband mode of propagation is generated in the waveguide by means of at least one ridge, the end of at least one ridge facing the holder being bevelled, and that radio-frequency signals are transmitted and received by using the wideband mode of propagation between the radio device and a coupling installed in the waveguide.

In a solution according to preferred embodiments of the invention, a waveguide is utilized in performing RF tests. Waveguides are tubes of a conductive material (or coated with a conductive material) wherein the radio-frequency signal propagates as an electromagnetic wave. By closing both ends of the waveguide with a material corresponding to the walls, a chamber is achieved. The cross section of the waveguide is usually some simple geometric form.

The waveguide comprises an opening, wherein a holder preferably having a handle is adaptable for a radio device. Due to the holder, the radio device can be mounted to the inside the waveguide such that the device is at least partly inside the guide. The part of the radio device remaining outside the guide is inside the holder. The dimensions of the holder and the length of the handle of the holder are selected to prevent radio-frequency radiation from propagating via the holder out of the waveguide. If desired, the holder can be built closed. The holder can be provided with small openings or a control mechanism enabling control of the radio device during the measurement. The waveguide comprises one or more couplings for transmission and reception of a radio-frequency signal. The coupling is preferably coupled to measurement equipment. The coupling can be implemented by means of a probe, loop or iris.

The method and arrangement according to preferred embodiments of the invention provide a plurality of advantages. RF measurements can be carried out without radiation losses. The implementation does not either require any mechanical contact with the device being measured for measuring radio-frequency radiation. This makes the repeatability of the measurement good. The implementation is not either sensitive to the positions of the radio device. The waveguide can be implemented at low cost. The calibration of the measurement arrangement can also be implemented in an automated manner.

The arrangement is suitable for testing radio devices, such as for instance mobile phones, pagers and the like. The devices do not need to have an external antenna or one projecting from the body of the device, but the antenna may also be integrated inside the device. The same waveguide structure can be used for testing several different devices. The holder of the device is preferably selected separately for each device type. For example, mobile phones used in the GSM900, GSM1800, PCS1900, WCDMA and CDMA radio systems can be tested with the arrangement presented. The device to be tested can be a portable device, such as for instance a mobile phone, but the solution is also applicable to other devices that are not intended to be portable. In this case, the part of the radio device radiating radio frequencies is located at least partly inside the waveguide by means of the holder, the radiating part remaining outside the waveguide remaining inside the holder.

BRIEF DESCRIPTION OF THE DRAWINGS

In the following, preferred embodiments of the invention will be described in detail with reference to the accompanying drawings, in which.

DETAILED DESCRIPTION OF THE PREFERRED EMBODIMENTS

Figure 1:
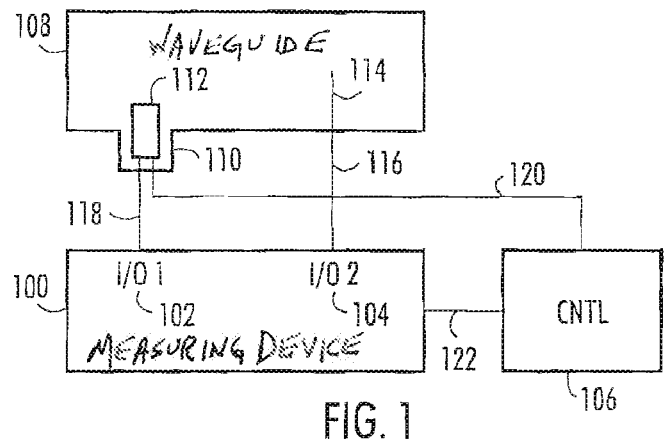
FIG. 1 shows an example of a set of testing equipment.

An example of a set of testing equipment will be studied with reference to FIG. 1. The equipment comprises a measuring device 100 configured to process radio-frequency signals. The measuring device preferably comprises two input/output ports 102, 104 by means of which it is capable of transmitting and receiving radio-frequency signals and of transmitting control commands to devices to be tested. Such measuring devices are known per se in the art. The equipment may further comprise a controller 106 for controlling the operation of the measuring device by means of a bus 122. The controller may be for instance a computer provided with measuring software or another measuring unit. The equipment further comprises a waveguide 108, which, in turn, comprises a holder 110 by means of which a radio device 112 to be tested or a radiating part thereof is inserted at least partly inside the waveguide. The waveguide also comprises at least one probe 114 inside the waveguide for transmitting and receiving a radio-frequency signal. The probe 114 is operatively connected to the measuring device with a coaxial line 116, for example. The device to be tested may also be operatively connected to the measuring device for instance with a line 118 for the transfer of control and test information. The controller 106 can also be connected by means of a bus 120 to the device to be measured for the control and collection of test information.

The equipment may also comprise other components. When the equipment is used for testing a large number of radio devices, a large part of the functions can be automated. For example, the replacement of the radio devices to be tested can be automated to take place by means of a robotic hand. The measuring software of the controller can perform a large number of measurements automatically, by controlling both the measuring device 100 and the device to be tested by means of the buses 122, 120. The holder 110 may further comprise small openings at the keys of the radio device to be tested, enabling the adjustment of the radio device during the test also manually, for instance by means of a robotic hand.

Figure 2A:
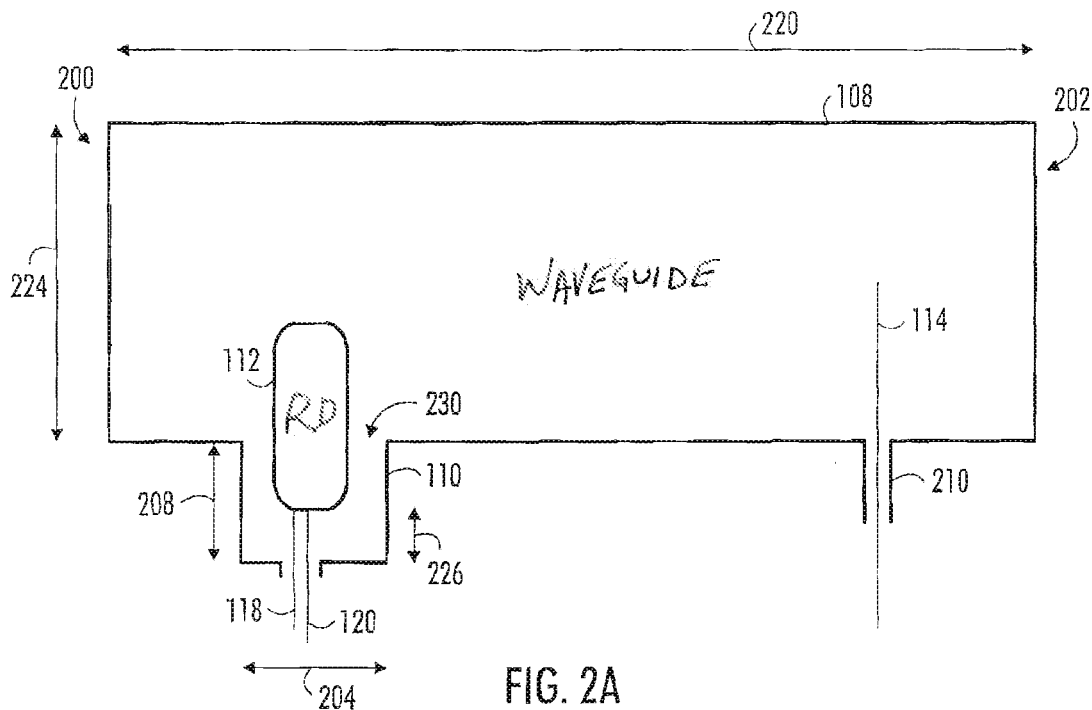
FIGS. 2A and 2B illustrate an example of an arrangement.
Figure 2B:
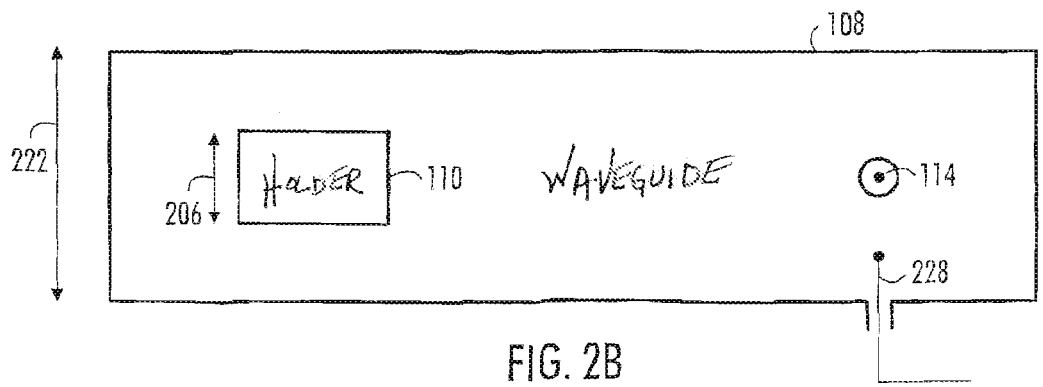

FIGS. 2A and 2B illustrate an example of an arrangement according to an embodiment by means of simplified diagrams. FIG. 2A is a side view of the waveguide 108. FIG. 2B is a top view of the waveguide 108. The waveguide 108 can be implemented as a tube closed at both its ends 200, 202. The tube may be of metal or a material coated with a conductive substance, such as for instance metal-coated plastic or ceramic. At one of its sides, the waveguide comprises an opening 230 for the holder 110. The holder 110 is configured to hold the portable radio device 112 at least partly inside the waveguide 108, the part of the radio device 112 remaining outside the waveguide being in its entirety inside the holder. The holder may be of metal or a material coated with a conductive substance. The radio device is preferably inside the waveguide such that the antenna parts of the radio device are inside the waveguide. This way the device is best able to transmit and receive signals in the waveguide. All devices have no external antenna, the antenna being integrated inside the device. The waveguide is particularly suitable for testing such devices. The holder can also be implemented such that the holder and the radio device are entirely inside the waveguide.

The dimensions of the holder 110, i.e. width 204, thickness 206 and the length 208 of the part of the holder projecting from the waveguide are selected according to the dimensions of the device to be tested. The cross-sectional shape of the holder conforms to the external dimensions of the radio device to be tested, and the length of the part of the holder projecting from the waveguide is selected such that radio-frequency radiation does not propagate out from the end of the holder opposite to the waveguide. This is based on the dimensions of the holder being so small that the waveforms existing in the waveguide are unable to propagate in the holder, i.e. the 'cut-off' of the holder, i.e. the chopping frequency inside the holder is higher than the frequencies of the waveforms existing in the waveguide. The body of the holder preferably extends somewhat 226 below the terminal 112. Such a holder structure provides the advantage of radio-frequency radiation not propagating outside the waveguide when the bottom of the holder is not closed. This increases the accuracy of the measurement results for instance when several sets of testing equipment are placed into each others immediate proximity. Since radiation does not propagate to the outside of the waveguide, the devices to not interfere with each other. The end of the holder opposite to the waveguide can also be closed with a cover made from a conductive substance or coated with a conductive substance. In this case, lead-ins may be provided for any cables 118, 120 in the closed holder. If the end of the holder is not closed, the cables 118, 120 are preferably grounded at their mantle to the holder. This eliminates the generation of undesired fields.

The holder 110 may be detachable from the waveguide, facilitating the replacement of the device 112 to be tested. The waveguide 108 and the holder 110 are preferably adapted to one another in a manner enabling automated detachment and reinstallation of the holder. Accordingly, the waveguide comprises an opening 230 for the holder, and the edges of the opening may comprise suitable fastening elements (not shown in FIGS. 2A and 2B). Each time, the holder settles in the same position and at the same depth relative to the waveguide. This is essential when repeating measurements are performed on different radio devices, for example, since this ensures that the devices are in the same position and thus the measurement results are mutually comparable.

Furthermore, the structure of the holder may enable the placement of the device to be tested therein in different positions, relative to its vertical axis, for example. This allows measurements to be made from different directions.

A special holder for ensuring the suitability of the dimensions can preferably be produced for each tested device of a different type or having different dimensions.

The waveguide 108 further comprises a lead-in 210 for the probe 114. The probe transfers the waveform propagating in the waveguide into the coaxial line 116 connected to the measuring device. The probe also couples the signal, transmitted from the measuring device, to the waveguide.

Consequently, the waveguide does not need to be closed tightly, since the tightness relative to RF signals is based on chopping frequencies. The waveforms propagating in the waveguide are not able to propagate along paths having sufficiently small dimensions. For this reason, both the holder and the lead-ins of the probes do not cause significant leakage of RF signals to the environment.

In waveguides, radio-frequency waves propagate in different waveforms having different propagation rates and different field distributions. Usually the lowest possible waveform is used, and the frequency band is restricted in a manner preventing the propagation of the following waveform.

The dimensions of the waveguide, i.e. length 220, width 222, and height 224, affect the waveforms present in the waveguide. The width 222 of the waveguide determines the base frequency range propagating in the waveguide. The length and height, in turn, affect the width of the frequency band. These facts are known to a person skilled in the art, and therefore the dimensioning of the waveguide is not described in more detail herein.

Broadband and/or multiple band operation can be achieved by utilizing different waveguide geometries and/or different modes of propagation inside the waveguide. By selecting different cross-sectional shapes for the waveguide 108, the waveforms present in the waveguide can be affected. FIGS. 3A to 3E illustrate examples of the cross sections of a waveguide. Rectangular (FIG. 3A), circular (FIG. 3B) or elliptical (FIG. 3C) cross sections may require several modes of propagation in order for multiple band operation to be achieved. Ridged cross sections (FIGS. 3D and 3E) enable an up to more than 4:1 ratio (ratio of upper limit frequency to lower limit frequency, e.g. 800 to 3200 MHz) in one mode of propagation of the useful bandwidth. In the case of a rectangular cross section, the sides of the rectangle are often in the ratio 1:2, but other dimensions are also feasible, such as a square, for example.

Figure 3A:
FIGS. 3A to 3F show examples of the cross-sectional shapes of a waveguide.
Figure 3B:
Figure 3C:
Figure 3D:
Figure 3E:
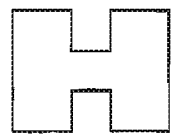
Figure 3F:
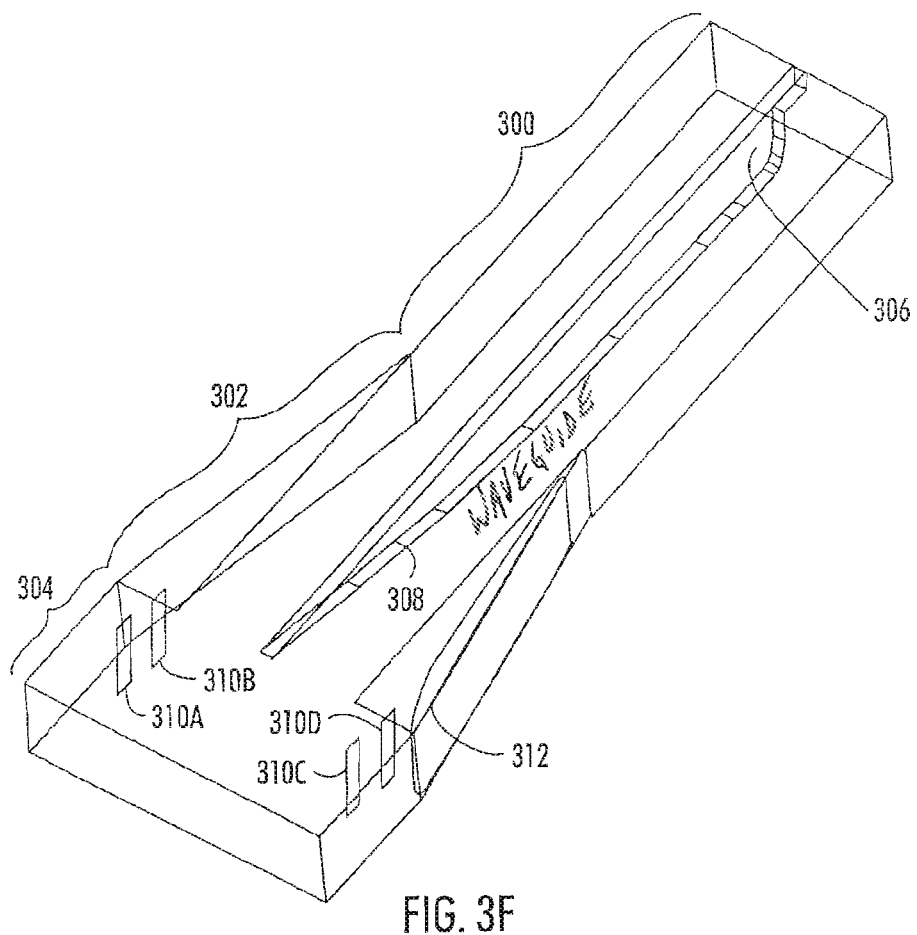

FIG. 3F illustrates an embodiment in more detail. In this embodiment, the waveguide comprises a cross section that is rectangular at its one end, the cross section being constant along a given length 300 in the direction of the longitudinal axis of the waveguide. In the direction of the longitudinal axis, in the middle of the waveguide is a section where either the height or width, or both, of the waveguide increase 302. The second end of the waveguide is again constant along a given length 304 in the direction of the longitudinal axis. The holder for the device to be tested is located in section 304. However, this is not shown in the figure for the sake of clarity.

The waveguide comprises one or more ridges in the direction of the longitudinal axis, the end on the side of the holder of at least one ridge being bevelled. In the example of FIG. 3F, the waveguide comprises one ridge 306 fastened to the wall of the waveguide. The ridge comprises a bevel 308 at the end on the side of the holder.

The ridge, the bevelling of the ridge and the cross-sectional shape of the waveguide achieve the broadband mode of propagation in the waveguide. The mode of propagation is sufficiently wide, covering more than one mobile phone frequency band. The typical frequency range achieved with one broadband mode of propagation is 0.8 to 2.2 GHz, for example. Accordingly, the same arrangement can be used to test several frequency bands, e.g. frequency bands used by the GSM, UMTS or WCDMA systems. This brings about significant savings in measurement costs.

To improve the broadband property of the mode of propagation, different solutions can also be utilized in the waveguide. In an embodiment, the end of the waveguide on the side of the holder may comprise one or more pegs 310A to 310D made from a conductive material and fastened to the inner surface of the waveguide. The pegs are in contact with the waveguide only at their ends. The pegs are used to absorb harmful waveforms. One end of at least one peg is fastened to the same wall of the waveguide as one ridge.

In an embodiment, absorption material 312 is fastened to the inner surface of the waveguide at the end on the side of the holder. Single-layered or multilayered absorption material can be fastened to the inner surface of the waveguide on one wall as one or more strips, for example. The absorption material absorbs harmful waveforms in the waveguide.

FIGS. 2A and 2B show one probe 114 whose lead-in is placed onto the same wall as the holder. Several couplings that may be of different types may also be installed in the waveguide. Such include for instance a loop enabling a magnetic coupling, and an iris enabling a coupling to another waveguide. Several couplings can be used to measure different waveforms independently. FIG. 2B shows by way of example a loop 228 placed perpendicularly to the probe 114.

Figure 4:
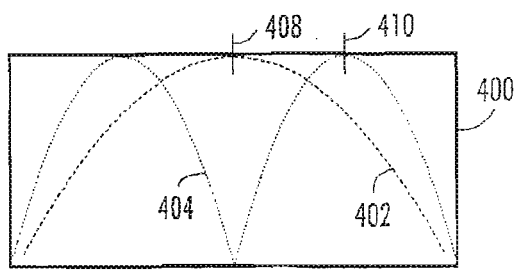
FIG. 4 illustrates different waveforms in a rectangular waveguide.

FIG. 4 illustrates two different waveforms appearing in a waveguide 400 having a rectangular cross section. The base waveform $TE_{10}$ is denoted in the figure with reference numeral 402 and the second waveform $TE_{20}$ is denoted in the figure with reference numeral 404. The maximums of the waveforms hit different points in the waveguide. The base waveform has one maximum in the middle of the guide, whereas the second waveform has two maximums symmetrically on both sides of the middle of the guide. This can be utilized in the placement of the probes by placing the probe 408 measuring the base waveform in the middle and the probe 410 measuring the second waveform in the second maximum point of the second waveform.

At the beginning of a radio device testing procedure, the device 112 to be tested is placed into the holder 110, separate from the waveguide 108. Any cables are connected to the device, optionally through holder lead-ins. The holder 110 is then fastened to the waveguide 108 to the opening in the waveguide by means of fastening means adjacent the opening. In a second alternative, the device is installed inside a holder that is fastened to the waveguide. In this case, the device to be tested settles at least partly inside the waveguide in such a manner that the antenna parts of the device are substantially inside the waveguide and that the part remaining outside the waveguide is entirely inside the holder.

The measuring device is then able to perform various measurements. The radio device 112 may be controlled to a transmission state by means of the controller 106, the measuring device 100 or the keyboard of the device, the antenna of the device radiating RF power into the waveguide. One or more probes 114 or a loop in the waveguide are used to receive the signal transmitted by the device almost without loss, and the received signal is transferred by means of the cables 116 to the measuring device 100. In the same way, the radio device 112 can be controlled to a reception state, and the measuring device is able to transmit a signal to the waveguide by means of the probe. The radio device receives the signal and can be controlled to make measurements on the signal and to report the measured results to the measuring device or the controller.

Figure 5:
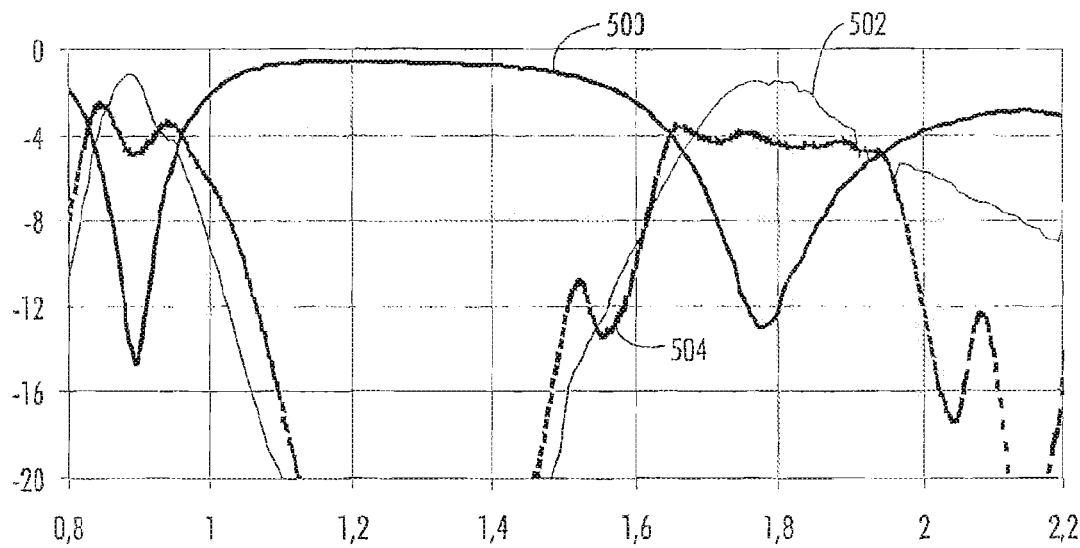
FIG. 5 illustrates measurement by means of an arrangement.

FIG. 5 illustrates a measurement carried out by means of the arrangement. The figure shows the measurement result of a given device to be tested. The horizontal axis shows the tested frequency range 800 MHz to 2.2 GHz, which thus simultaneously comprises several frequency bands intended for mobile phones. The vertical axis shows signal attenuation in decibel. Graph 500 is the measured adaptation of the tested device in a free space. In addition, the radiation efficiency is measured from the antenna as a function of frequency, and it describes the losses occurring in the antenna. The adaptation and the radiation efficiency can be used to determine the power radiated by the antenna. Graph 502 shows the relative effect radiated by the antenna in a free space. Graph 504 describes a corresponding parameter measured by the testing arrangement. The difference between graphs 502 and 504 is primarily due to the loss of the testing arrangement and partly to the effect of the arrangement on the antenna (load). This difference can be eliminated by means of a calibration measurement, after which the arrangement can be used to directly measure results comparable with the free space measurement.

Figure 6:
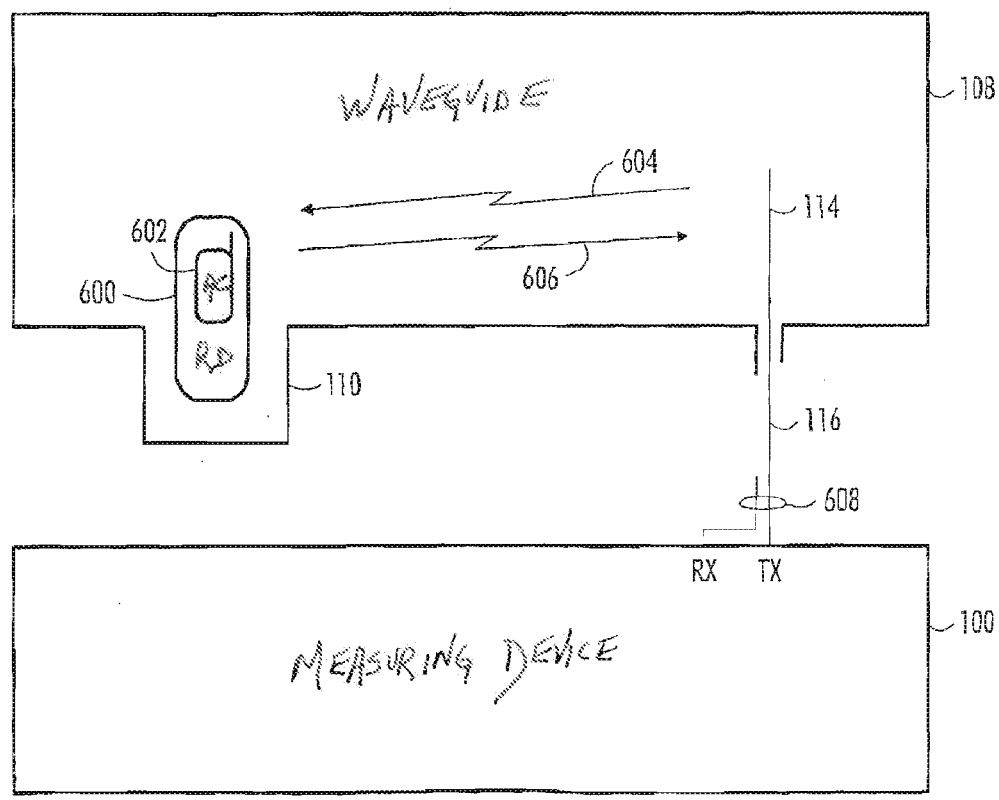
FIG. 6 illustrates the calibration of an arrangement.

Let us next study the method of calibrating the presented arrangement by means of FIG. 6. The calibration of the arrangement is an essential procedure as regards measurement results. The calibration serves to find out the characteristics of the system and any losses for instance in the cabling 116. In the calibration, in place of the device to be tested, a reference unit 600 resembling the radio device to be tested and comprising a grounded antenna circuit 602 is placed into the holder 110. The measuring device transmits a known signal from a TX port via the cable 116 to the probe 114. The probe 114 radiates a signal 604 to the waveguide 108. The reference unit receives the signal and, due to the grounded antenna, reflects the signal as such immediately back 606. The probe 114 transfers the reflected signal back to the cable 116. To the cable 116, a directional contactor 608 is coupled, which transfers the received reflected signal to the RX input of the measuring device. Since the fed signal and the received signal have travelled via the same propagation path, cable attenuation can be determined by comparing the signals. In the calculation, the attenuation caused by the directional contactor 608 is taken into account.

The calibration presented can be performed automatically. For example, in a situation where a large number of radio devices are tested and where the radio devices to be tested are placed mechanically, for instance by means of a robot, into the holder and removed from the holder, and the measuring device can be programmed to place the reference unit into the holder and perform calibration always at given intervals, for instance at intervals of a hundred measurements. This ensures that the measurement results of the radio devices to be tested are comparable.

Although the invention is described above with reference to the example according to the attached drawings, it is apparent that the invention is not limited thereto, but can be modified in a plurality of ways within the inventive idea disclosed in the appended claims.

The invention claimed is:

1. An arrangement for testing a radio device comprising: a waveguide closed at both of its ends; and
comprising a holder arranged to hold the radio device partly inside the waveguide in such a manner that at least a portion of the radiating part of the radio device remains outside the waveguide, the at least a portion of the radiating part of the radio device remaining outside the waveguide being entirely inside the holder, wherein the waveguide comprises:
one or more ridges extending along a longitudinal axis of the waveguide, the end of at least one ridge facing the holder being bevelled; and
one coupling inside the waveguide for transmission and reception of a radio-frequency signal by the use of a wideband mode of propagation;
wherein the end of the waveguide on the side of the holder comprises one or more pegs made from a conductive substance and fastened to the inner surface of the waveguide.

2. An arrangement as claimed in claim 1, wherein the pegs are in contact with the waveguide only at their ends.

3. An arrangement as claimed in claim 1, wherein one end of at least one peg is fastened to the same wall of the waveguide as one ridge.

4. An arrangement as claimed in claim 1, wherein absorption material is fastened to the inner surface of the waveguide at the end on the side of the holder.

5. An arrangement as claimed in claim 4, wherein single-layered or multilayered absorption material is fastened to the inner surface of the waveguide as one or more strips.

6. An arrangement as claimed in claim 1, wherein the cross-sectional shape of the holder conforms to the external dimensions of the radio device to be tested and that the length of the holder is selected in a manner preventing radio-frequency radiation from propagating out from the end of the holder opposite to the waveguide.

7. An arrangement as claimed in claim 1, wherein the end of the holder opposite relative to the waveguide is closed.

8. An arrangement as claimed in claim 1, wherein the holder is configured to hold the radio device inside the waveguide in such a manner that the antenna part of the radio device is inside the waveguide.

9. An arrangement as claimed in claim 1, wherein the cross section of the waveguide is selected according to the desired frequency range to be tested.

10. An arrangement as claimed in claim 1, wherein the arrangement comprises an electric or magnetic coupling of the radio-frequency radiation propagating in the waveguide to a measuring device.

11. An arrangement as claimed in claim 1, wherein the coupling is implemented by means of a probe, loop or iris.

12. An arrangement as claimed in claim 1, wherein the holder comprises small openings at the keys of the radio device to be tested.

13. An arrangement as claimed in claim 1, wherein to the radio device to be tested is coupled a control signal that is transferred to the device by means of a cable, and that the holder comprises a lead-in for the cable.

14. An arrangement as claimed in claim 1, wherein the holder is detachably attachable to the waveguide.

15. An arrangement as claimed in claim 1, wherein the waveguide comprises an opening and fastening means for the holder.

16. A method of testing a radio device, wherein the radio device to be tested is mounted by means of a holder such that the radio device is held partly inside a waveguide closed at both of its ends, the method comprising:

generating a wideband mode of propagation in the waveguide by means of at least one ridge extending along a longitudinal axis of the waveguide, the end of the at least one ridge facing the holder being bevelled; and transmitting and receiving radio-frequency signals by using the wideband mode of propagation between the radio device and a coupling installed in the waveguide, at least a portion of the radiating part of the radio device remaining outside the waveguide, the at least a portion of the radiating part of the radio device remaining outside the waveguide being entirely inside the holder;

wherein one or more pegs made from a conductive material are fastened to the inner surface of the waveguide at the end of the waveguide on the side of the holder.

17. A method as claimed in claim 16, wherein the coupling adapts the radio-frequency signal propagating in the waveguide to a coaxial cable connected to a radio frequency measuring device.

18. A method as claimed in claim 16, further comprising transmitting and receiving radio-frequency signals between the radio device and at least one loop disposed in the waveguide, the loop transferring signal energy to a measuring device operationally coupled to the loop.

19. A method as claimed in claim 16, further comprising transmitting and receiving radio-frequency signals between the radio device and at least one probe disposed in the waveguide, the probe transferring signal energy to a measuring device operationally coupled to the probe.

20. A method as claimed in claim 16, further comprising performing the calibration of the test equipment by means of a reference unit having a grounded antenna circuit.

21. A method as claimed in claim 16, wherein the frequency area to be tested simultaneously comprises at least two frequency bands intended for mobile telephones.

* * * * *